US010162258B2

(12) United States Patent
Lin et al.

(10) Patent No.: US 10,162,258 B2
(45) Date of Patent: Dec. 25, 2018

(54) PELLICLE FABRICATION METHODS AND STRUCTURES THEREOF

(71) Applicant: Taiwan Semiconductor Manufacturing Co., Ltd., Hsin-Chu (TW)

(72) Inventors: Yun-Yue Lin, Hsinchu (TW); Hsuan-Chen Chen, Tainan (TW); Chih-Cheng Lin, Kaohsiung (TW); Hsin-Chang Lee, Hsinchu County (TW); Yao-Ching Ku, Hsinchu (TW); Wei-Jen Lo, Hsinchu (TW); Anthony Yen, Hsinchu (TW); Chin-Hsiang Lin, Hsin-Chu (TW); Mark Chien, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 22 days.

(21) Appl. No.: 15/381,033

(22) Filed: Dec. 15, 2016

(65) Prior Publication Data

US 2018/0173092 A1    Jun. 21, 2018

(51) Int. Cl.
*G03F 1/24* (2012.01)
*G03F 1/62* (2012.01)

(52) U.S. Cl.
CPC . *G03F 1/62* (2013.01); *G03F 1/24* (2013.01)

(58) Field of Classification Search
CPC ..... G03F 1/22; G03F 1/62; G03F 1/64; G03F 1/24
USPC .......................................................... 430/5
See application file for complete search history.

(56) References Cited

U.S. PATENT DOCUMENTS

| 6,841,317 | B2 | 1/2005 | Wang et al. |
| 7,718,008 | B2 | 5/2010 | Simada et al. |
| 8,628,897 | B1 | 1/2014 | Lu et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,724,088 | B2 | 5/2014 | Lin et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,418,847 | B2 | 8/2016 | Shen et al. |
| 9,658,526 | B2 | 5/2017 | Lin et al. |
| 9,664,999 | B2 * | 5/2017 | Shih ........................ G03F 1/64 |
| 9,690,190 | B2 * | 6/2017 | Kim ......................... C23F 1/14 |
| 9,952,502 | B2 * | 4/2018 | Jeon ......................... G03F 1/62 |
| 9,958,770 | B2 * | 5/2018 | Ahn .......................... G03F 1/62 |
| 2006/0246234 | A1 | 11/2006 | Meyers et al. |
| 2006/0263703 | A1 | 11/2006 | Zhang et al. |
| 2011/0244395 | A1 | 10/2011 | Huang et al. |
| 2012/0308922 | A1 | 12/2012 | Lin et al. |
| 2015/0212419 | A1 | 7/2015 | Shen et al. |
| 2016/0231647 | A1 | 8/2016 | Hsu et al. |
| 2017/0003585 | A1 | 1/2017 | Lin et al. |
| 2018/0059534 | A1 * | 3/2018 | Tu ............................ G03F 1/62 |
| 2018/0059535 | A1 * | 3/2018 | Tu ............................ G03F 1/64 |

FOREIGN PATENT DOCUMENTS

| CN | 203324647 | 12/2013 |
| KR | 10-2008-0062746 | 8/2009 |
| TW | 200832050 | 8/2008 |
| TW | 201510638 | 3/2015 |
| TW | 201516557 | 5/2015 |
| WO | WO2010041508 | 4/2010 |

OTHER PUBLICATIONS

Schwierz, Frank, "Graphene transistors", Nature Nanotechnology, Jul. 2010, pp. 487-496, vol. 5.
Deshpande, Tejas "Graphene Field Effect Transistors", http://technophilicmag.com/2011/02/07/graphene-field-effect-transistors.
L. Baraton et al. "On the mechanisms of precipitation of graphene on nickel thin films" EPL, European Physical Society/EDP Science/Societa Italiana di Fisica/IOP Publishing, 2011, 96, pp. 46003 (7 Pages).
Masaru Kobayashi et al., "Photocatalytic Activity of Titanium Dioxide and Zinc Oxide", Cosmetics & Toiletries Magazine, vol. 112, Allured Publishing Corp., U.S. Cosmetics Corp, Dayville, CT, USA, Jun. 1997, pp. 83-85.

* cited by examiner

*Primary Examiner* — Christopher G Young
(74) *Attorney, Agent, or Firm* — Haynes and Boone, LLP

(57) ABSTRACT

A method for fabricating a pellicle includes forming a first dielectric layer over a back surface of a substrate. After forming the first dielectric layer, and in some embodiments, a graphene layer is formed over a front surface of the substrate. In some examples, after forming the graphene layer, the first dielectric layer is patterned to form an opening in the first dielectric layer that exposes a portion of the back surface of the substrate. Thereafter, while using the patterned first dielectric layer as a mask, an etching process may be performed to the back surface of the substrate to form a pellicle having a pellicle membrane that includes the graphene layer.

20 Claims, 12 Drawing Sheets

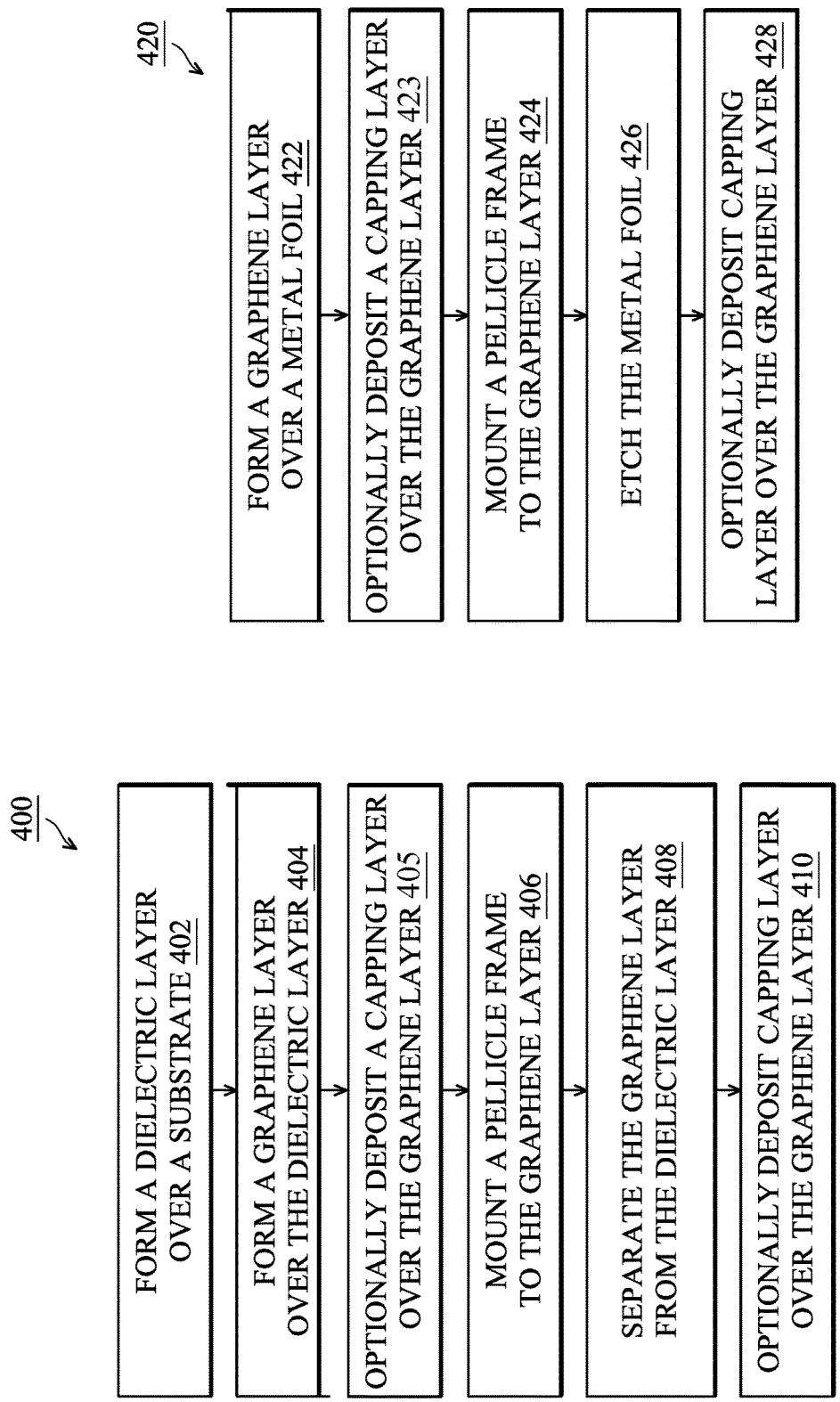

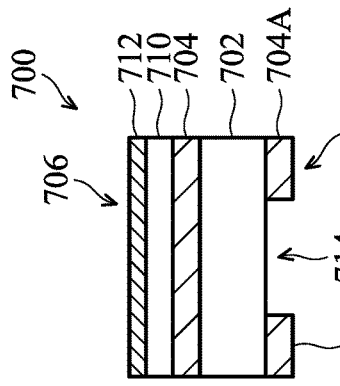
FIG. 7A
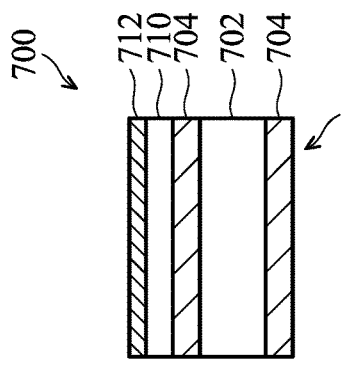
FIG. 7B
FIG. 7C
FIG. 7D
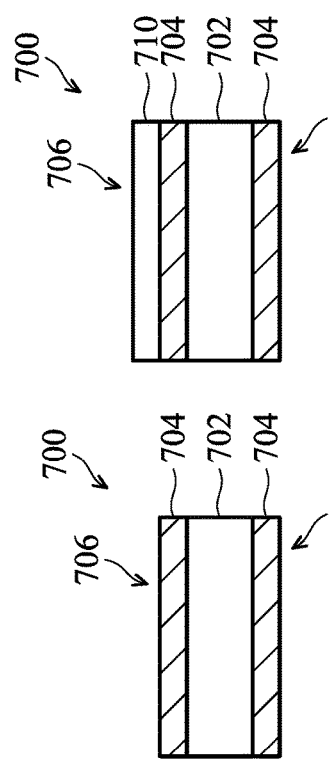
FIG. 7E
FIG. 7F
FIG. 7G

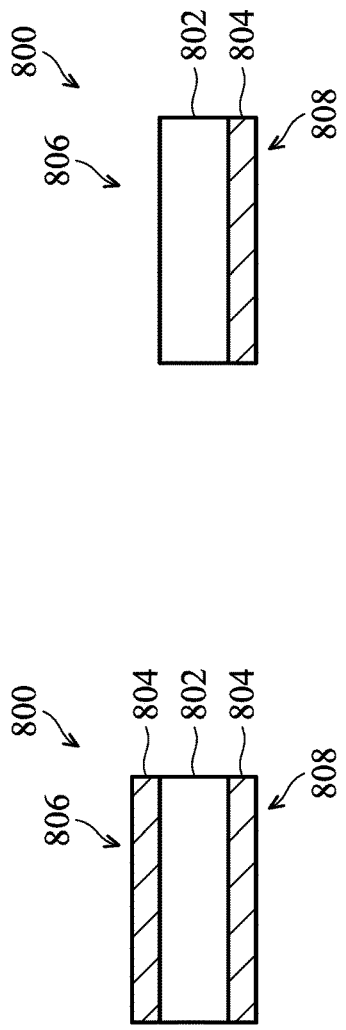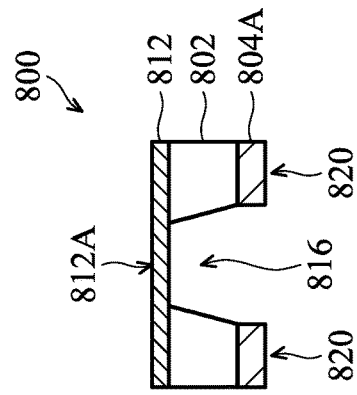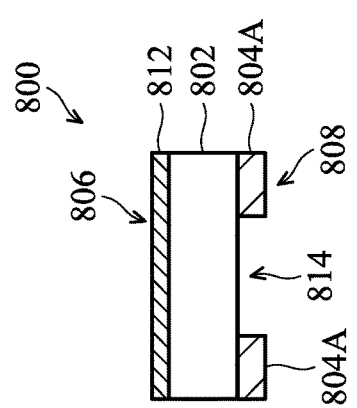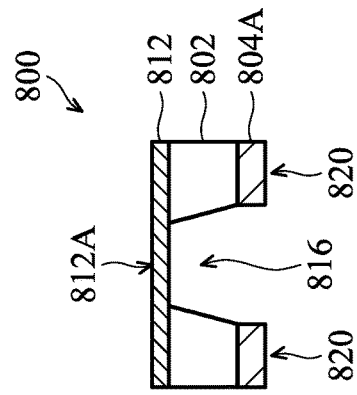
FIG. 8A FIG. 8B FIG. 8C FIG. 8D FIG. 8E

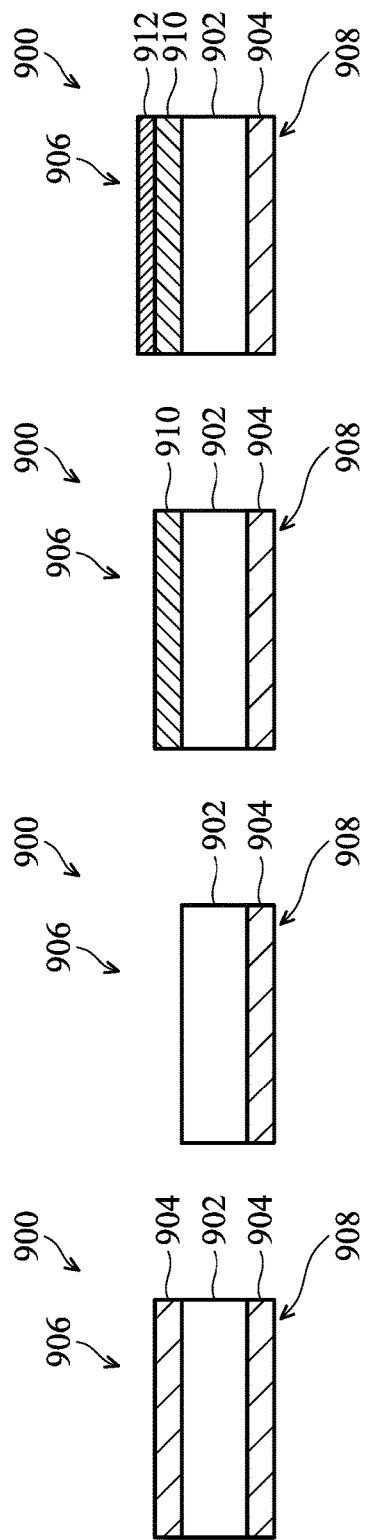

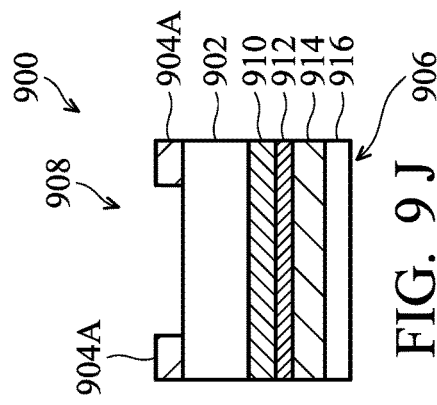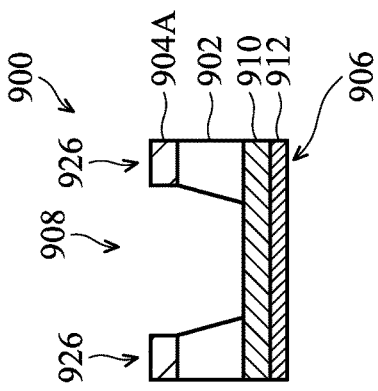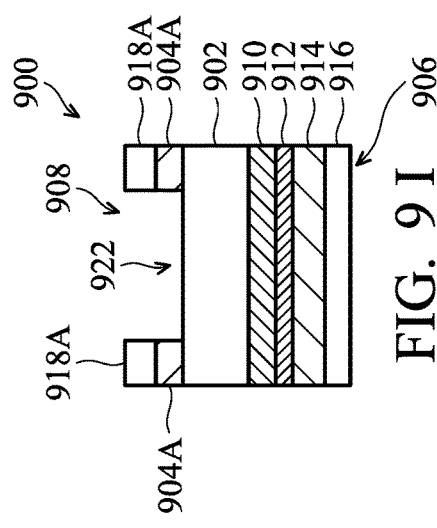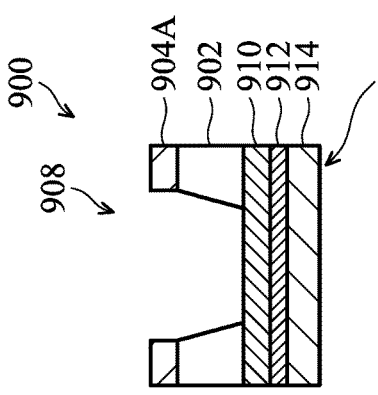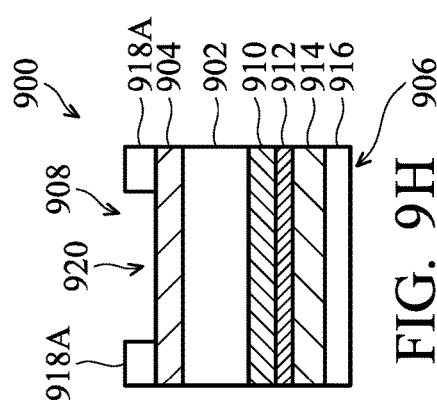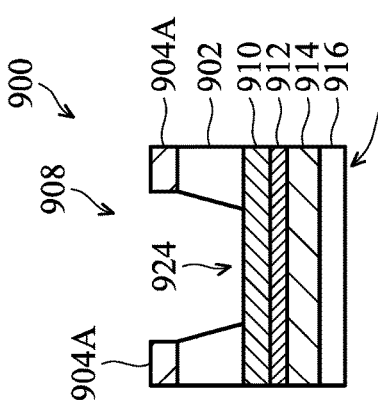

PELLICLE FABRICATION METHODS AND STRUCTURES THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. However, EUV systems, which utilize reflective rather than conventional refractive optics, are very sensitive to contamination issues. In one example, particle contamination introduced onto a reflective EUV mask can result in significant degradation of the lithographically transferred pattern. As such, it is necessary to provide a pellicle membrane over an EUV mask, to serve as a protective cover which protects the EUV mask from damage and/or contaminant particles. Additionally, to avoid a drop is reflectivity, it is important to use a thin, high-transmission material as the pellicle membrane. However, the fabrication of large, thin pellicle membranes according to certain conventional fabrication processes may cause the pellicle membrane to become distorted, wrinkled, broken, or otherwise damaged, thereby rendering the pellicle membrane unusable. In some conventional fabrication processes, the pellicle membrane may actually shatter, resulting in significant particle contamination within a processing chamber. Thus, existing pellicle fabrication techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4B, 4C, 4D, and 4E are flow charts of methods for fabricating a pellicle, according to one or more aspects of the present disclosure;

FIGS. 7A, 7B, 7C, 7D, 7E, 7F, and 7G illustrate cross-sectional views of an embodiment of pellicle fabrication according to one or more aspects of the method of FIG. 4C;

FIGS. 8A, 8B, 8C, 8D, and 8E illustrate cross-sectional views of an embodiment of pellicle fabrication according to one or more aspects of the method of FIG. 4D; and FIGS. 9A, 9B, 9C, 9D, 9E, 9F, 9G, 9H, 9I, 9J, 9K, 9L, and 9M illustrate cross-sectional views of an embodiment of pellicle fabrication according to one or more aspects of the method of FIG. 4E.

DETAILED DESCRIPTION

Figure 1:
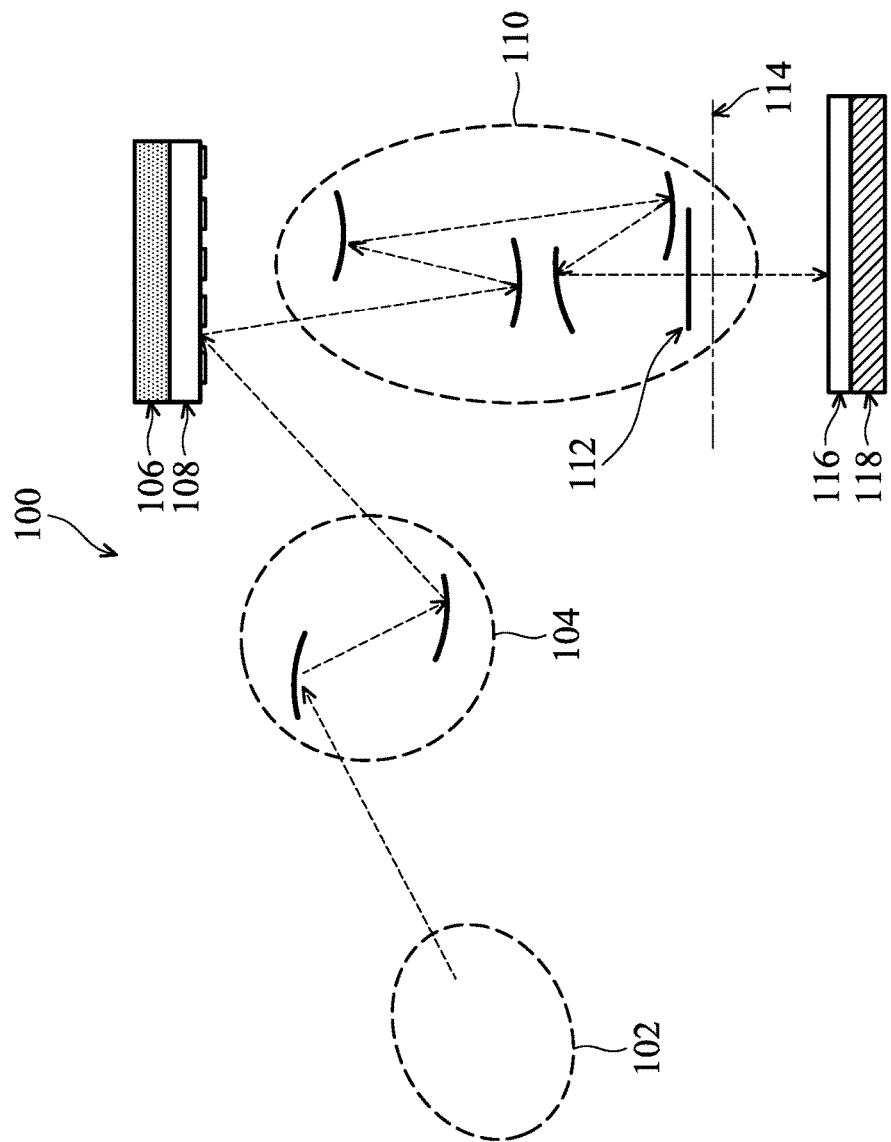
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as an EUV mask.

Illustrated in FIG. 1 is a schematic view of a lithography system 100, in accordance with some embodiments. In various embodiments, the pellicle membrane described herein may be coupled to an EUV mask utilized within the lithography system 100. The lithography system 100 may also be generically referred to as a scanner that is operable to perform lithographic processes including exposure with a respective radiation source and in a particular exposure mode. In at least some of the present embodiments, the lithography system 100 includes an EUV lithography system designed to expose a resist layer by EUV light. Inasmuch, in various embodiments, the resist layer includes a material sensitive to the EUV light (e.g., an EUV resist). To be sure, at least some embodiments described herein may include pellicle membranes coupled to a mask utilized within an optical lithography system, such as an optical lithography system using a deep UV (DUV) light source to expose a resist layer sensitive to the DUV light source. By way of example, some DUV light sources may include a KrF eximer laser (e.g., to provide a 248 nm light source), an ArF eximer laser (e.g., to provide a 193 nm light source), or an $F_2$ eximer laser (e.g., to provide a 157 nm light source). With reference to FIG. 1, the lithography system 100 shown therein includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

In some embodiments, the lithography system 100 also includes a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm². In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

Figure 2:
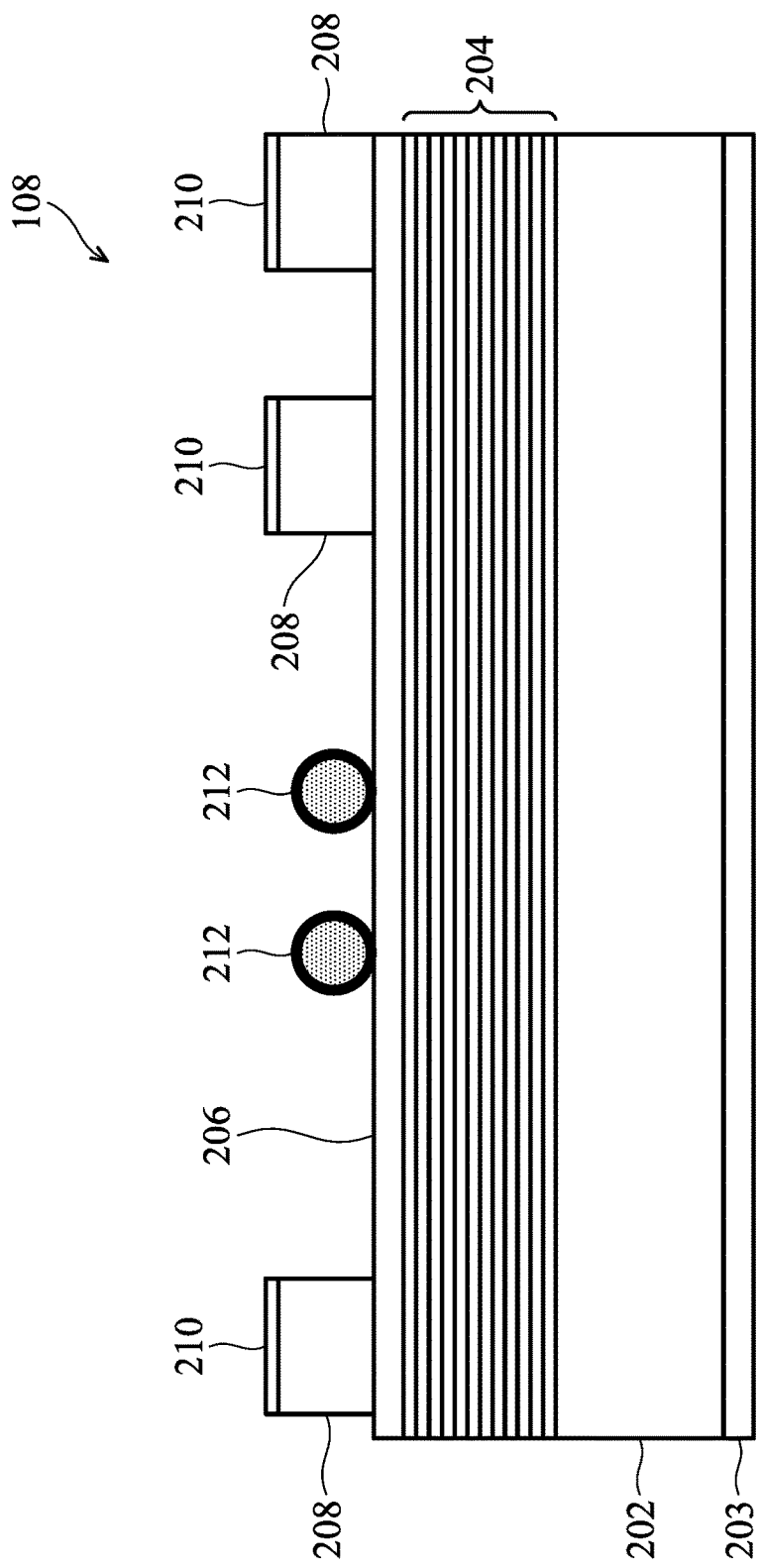
FIG. 2 is a cross-section of an EUV mask, in accordance with some embodiments.

Returning to the mask 108, and with reference to the example of FIG. 2, illustrated therein is an example cross-section of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, substrate 202 has a thickness of about 6.3 to 6.5 mm. In some examples, the backside coating 203 has a thickness of about 70-100 nm. By way of example, the multi-layer structure 204 may include molybdenum-silicon (Mo—Si) multi-layers deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a $Ta_xN_y$ layer or a $Ta_xB_yO_zN_u$ layer, which may have a thickness of about 50-75 nm and are configured to absorb EUV light (e.g., with a wavelength of about 13.5 nm). In some examples, other materials may be used for the absorbers 208, such as Al, Cr, Ta, and W, among others. In some examples, the ARC layer 210 includes at least one of a $Ta_xB_yO_zN_u$ layer, a $Hf_xO_y$ layer, or a $Si_xO_yN_z$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may include a PSM which utilizes interference produced by phase differences of light passing therethrough. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. As shown in FIG. 2, particles 212 may be unintentionally deposited on the surface of the capping layer 206 and can result in degradation of lithographically transferred patterns if not removed. Particles 212 may be introduced by any of a variety of methods such as during a chemical mechanical polishing (CMP) process, a cleaning process, and/or during handling of the EUV mask 108. While the particles 212 are illustrated as having a circular shape, it will be understood that other particle shapes and sizes are possible, and are intended to fall within the scope of the present disclosure.

Figure 3B:
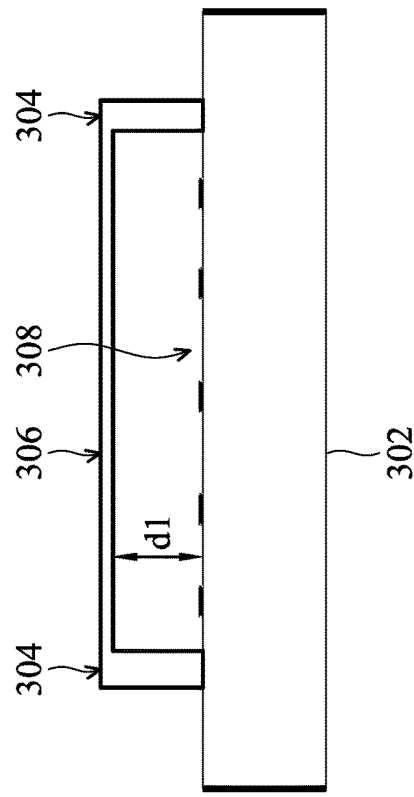
FIG. 3A is a top-view and FIG. 3B is a cross-sectional view of a mask and pellicle, according to some embodiments.
Figure 3A:
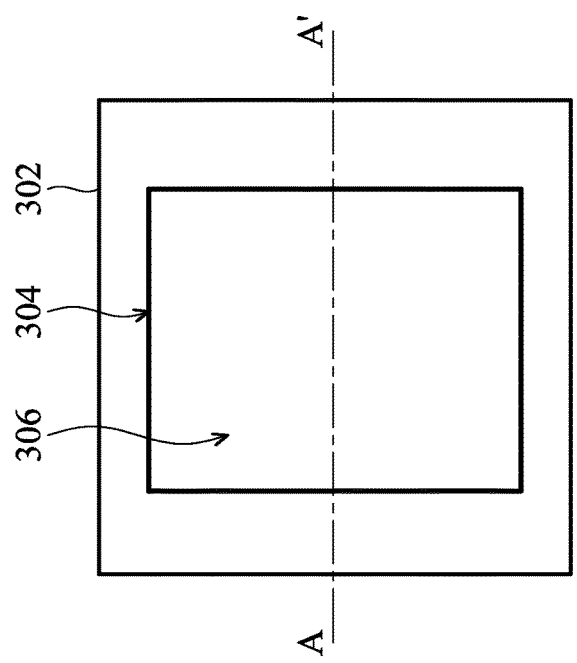

At least some existing methods for avoiding and/or removing particle contamination (e.g., particles 212) of a reflective EUV mask (e.g., the mask 108) include wet chemical processes to clean the mask. In some examples, such wet cleans may be performed with the addition of physical force, which can result in structural mask defects that can also cause a reduction in the quality of the lithographically transferred pattern. Alternatively, or in addition to, mask cleaning techniques, a pellicle membrane may be used over an EUV mask to serve as a protective cover which protects the mask from damage and/or contaminant particles. With reference to FIGS. 3A and 3B, illustrated therein is a top-view and a cross-sectional view, respectively, of a mask including a pellicle. In particular, FIGS. 3A/3B illustrate a mask 302 (e.g., a lithographic mask), a pellicle frame 304, and a pellicle membrane 306. As discussed above, the mask 302 may also include a patterned surface 308 used to pattern an image into a semiconductor substrate by a lithographic process. In some embodiments, the mask 302 may be substantially the same as the mask 108, discussed above. By way of example, the pellicle membrane 306 is suspended (e.g., by the frame 304) a distance 'd1' (e.g., several millimeters) away from the patterned surface 308 of the mask 302, while remaining within an optical path between the patterned surface 308 and a wafer to be patterned, such that any particles which land on the pellicle membrane 306 (e.g., rather than on the patterned surface 308) are held away from a focal plane of the projection optics 110 and will thus not be imaged onto a target semiconductor wafer. While at least some existing processes have used pellicles for optical lithography, pellicle membranes for EUV lithography have proved challenging to fabricate and implement, due at least in part to the difficulty of providing a thin, highly transmissive pellicle membrane with sufficient structural integrity to span the surface of the mask (e.g., the mask 108 or the mask 302). The fabrication of large, thin pellicle membranes according to certain conventional fabrication processes has been shown to cause the pellicle membrane to become distorted, wrinkled, broken, or otherwise damaged, thereby rendering the pellicle membrane unusable. Additionally, in at least some fabrication processes, the pellicle membrane may actually shatter, resulting in significant particle contamination within a process chamber. For example, some existing processes may fabricate a pellicle membrane using a thin (e.g., 50 nm) layer of polysilicon, which may have insufficient mechanical strength, low thermal emissivity, and/or low thermal conductivity. During an exposure process, for example when EUV light hits the pellicle membrane, the temperature of the pellicle membrane may increase substantially. Thus, due at least in part to the poor thermal properties of some pellicle membranes, such increases in temperature may cause excessive stress and lead to the pellicle membrane shattering and contaminating the process chamber. Thus, existing EUV mask pellicle fabrication techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments of the present disclosure provide an EUV pellicle fabrication method and related structures which employ a carbon-based pellicle membrane such as a graphene pellicle membrane, a graphene-silicon carbide (SiC) pellicle membrane, and/or a SiC pellicle membrane. The carbon-based pellicle membranes disclosed herein provide superior mechanical and thermal properties, for example, as compared to at least some existing pellicle membranes. Consider, for example, the physical properties of graphene and SiC as compared to polysilicon, which as described above, is used in at least some conventional pellicle membranes. Emissivity, a measure of a material's effective ability to emit thermal radiation from its surface and having a maximum value of 1 (unitless), is equal to about 0.02 for polysilicon, while it is equal to about 0.83 for graphene and SiC. Thermal conductivity, a measure of a material's ability to conduct heat, may be equal to about 34.5 W/mK for polysilicon, while it is equal to about 360 W/mK for SiC and about 2000-5000 W/mK (in-plane) for graphene. An indication of the mechanical strength of a material may be given by the Young's modulus value for the material, where the Young's modulus is a measure of the stiffness of the material. By way of example, the Young's modulus for polysilicon is equal to about 157 GPa, while the Young's modulus for SiC is about 400 GPa, and the Young's modulus for graphene is about 1000 GPa. Thus, embodiments of the carbon-based pellicle membranes disclosed herein have excellent mechanical and thermal properties as compared to at least some existing pellicle membranes. For example, because of their superior thermal emissivity and thermal conductivity, the temperature of the carbon-based pellicle membranes will remain substantially lower (e.g., during EUV light exposure) than polysilicon-based pellicle membranes. Adding superior strength to the favorable thermal properties, embodiments of the present disclosure thereby effectively mitigate the stress, and the potential pellicle membrane shattering and process chamber contamination issues, which remains a significant challenge for at least some existing processes. Moreover, the carbon-based pellicle membranes disclosed herein provide superior EUV transmission. For example, the EUV transmittance of a polysilicon pellicle membrane (e.g., 50 nm thick) may be about 84%, while the EUV transmittance of a graphene pellicle membrane and/or a graphene-SiC pellicle membrane (e.g., about 10-20 nm thick) may be greater than or equal to about 90%. Thus, embodiments of the present disclosure provide pellicle membranes that are stronger and more reliable than their existing counterparts, thereby extending the pellicle lifetime and practical usage. Those skilled in the art will recognize other benefits and advantages of the methods and structures as described herein, and the embodiments described are not meant to be limiting beyond what is specifically recited in the claims that follow.

Referring now to FIGS. 4A, 4B, 4C, 4D, and 4E, illustrated therein are flow charts of methods 400, 420, 440, 460, and 480 for fabricating a pellicle, according to one or more aspects of the present disclosure. By way of example, each of the methods 400, 420, 440, 460, and 480 provide a method to fabricate a carbon-based pellicle including, for example, a graphene pellicle membrane, a graphene-silicon carbide (SiC) pellicle membrane, and/or a SiC pellicle membrane. It is noted that the process steps of the methods 400, 420, 440, 460, and 480, including any descriptions given with reference to the figures, are merely exemplary and are not intended to be limiting beyond what is specifically recited in the claims that follow. Moreover, additional process steps may be implemented before, during, and after the methods 400, 420, 440, 460, and 480, and some process steps described above may be replaced or eliminated in accordance with various embodiments of the methods 400, 420, 440, 460, and 480. It is also understood that parts of the methods 400, 420, 440, 460, and 480 may be implemented using a well-known complementary metal-oxide-semiconductor (CMOS) technology process flow, and thus some processes are only briefly described herein.

Referring first to FIG. 4A, provided therein is a method 400 to fabricate a carbon-based pellicle including a graphene pellicle membrane, in accordance with some embodiments. Additionally, FIGS. 5A-5F include various cross-sectional views of a pellicle 500 at various stages of fabrication according to the method 400. The method 400 begins at block 402 where a substrate is provided, and a dielectric layer is formed over the substrate. With reference to the example of FIG. 5A, in an embodiment of block 402, a dielectric layer 504 is deposited over a substrate 502. By way of example, the substrate 502 may include a silicon substrate. In some embodiments, the substrate 502 may alternatively and/or additionally include germanium, silicon-germanium, another III-V compound, one or more thin film layers, or other suitable substrate material. As shown in the example of FIG. 5A, the dielectric layer 504 may be deposited over a front surface 506 and over a back surface 508 of the substrate 502. In some embodiments, the dielectric layer 504 may include a silicon nitride (SiN) layer. In some cases, the dielectric layer 504 may include a low pressure silicon nitride (LPSiN) layer that may be deposited, for example, by a low pressure chemical vapor deposition (LPCVD) process. To be sure, in some examples, the dielectric layer 504 may alternatively be deposited by atomic layer deposition (ALD), physical vapor deposition (PVD), other CVD techniques, or by other suitable processes. In some embodiments, the dielectric layer 504 may alternatively and/or additionally include a silicon oxide layer, a silicon oxynitride layer, or other suitable dielectric layer. In some examples, the dielectric layer 504 may have a thickness equal to about 50 nm.

The method 400 proceeds to block 404 where a graphene layer is formed over the dielectric layer. With reference to the example of FIG. 5B, in an embodiment of block 404, a graphene layer 510 is formed over the dielectric layer 504 on at least one of the front surface 506 and back surface 508 of the substrate 502. In the example of FIG. 5B, the graphene layer 510 is formed over the dielectric layer 504 on the front surface 506 of the substrate 502. In various embodiments, the graphene layer 510 serves as the pellicle membrane, as discussed below. In some embodiments, a graphene layer may be formed over the dielectric layer 504 on both the front surface 506 and the back surface 508 of the substrate 502, such that either graphene layer (e.g., formed on the front or back surface) may be used for subsequent pellicle membrane formation. In some embodiments, the graphene layer 510 may be directly grown on the dielectric layer 504, for example, using a CVD process. In some examples, such a CVD process may include a catalyst-free CVD process. Alternatively, in some embodiments, the graphene layer 510 may include graphene transferred from another substrate onto the dielectric layer 504. For example, in some cases, the graphene layer 510 may include graphene formed by epitaxial growth on a silicon carbide (SiC) substrate, CVD-growth (e.g., involving the catalyzed decomposition of hydrocarbons on a metal surface), or mechanical exfoliation (e.g., from a bulk graphite source), among others. By way of example, such graphene grown on or exfoliated from another substrate may then be transferred onto the dielectric layer 504, for example, using a wet or dry transfer process. Additionally, in various embodiments, the graphene layer 510 may include monolayer graphene, bilayer graphene, or multi-layer graphene (e.g., including more than two layers).

The method 400 then proceeds to block 405 where a capping layer is optionally deposited over the graphene layer of the pellicle. In various embodiments, the capping layer may have low EUV absorption, good emissivity, and serves to protect the graphene layer 510. To be sure, the capping layer may not be deposited or may alternatively be deposited at block 410, and for purposes of this disclosure, further details regarding the composition of the capping layer is discussed below with reference to block 410. In at least some embodiments, however, the pellicle frame (block 406) may be mounted after deposition of the capping layer.

Thereafter, the method 400 proceeds to block 406 where a pellicle frame is mounted onto the graphene layer. With reference to the example of FIG. 5C, in an embodiment of block 406, a pellicle frame 512 may be mounted to the graphene layer 510 by way of an adhesive (e.g., glue) layer 514. In some embodiments, the pellicle frame 512 may include a vent hole (e.g., with a filter) in order to equalize pressure between the pellicle and the scanner environment.

Figures 5A, 5B, 5C:
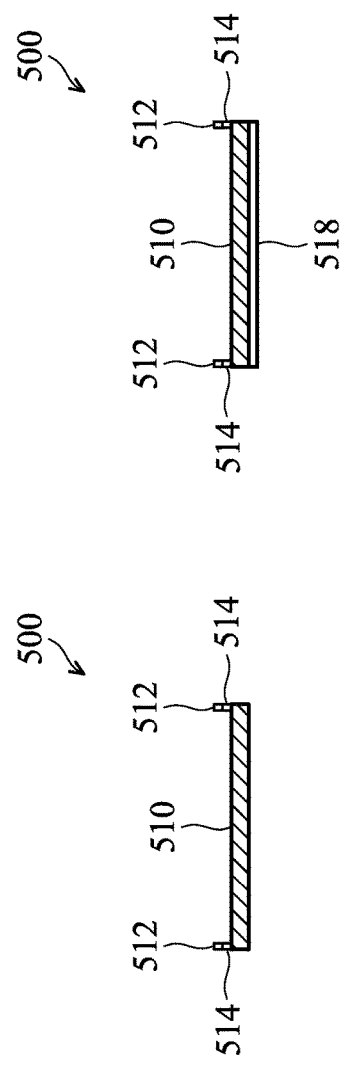
FIGS. 5A, 5B, 5C, 5D, 5E, and 5F illustrate cross-sectional views of an embodiment of pellicle fabrication according to one or more aspects of the method of FIG. 4A.
Figures 5D, 5E, 5F:
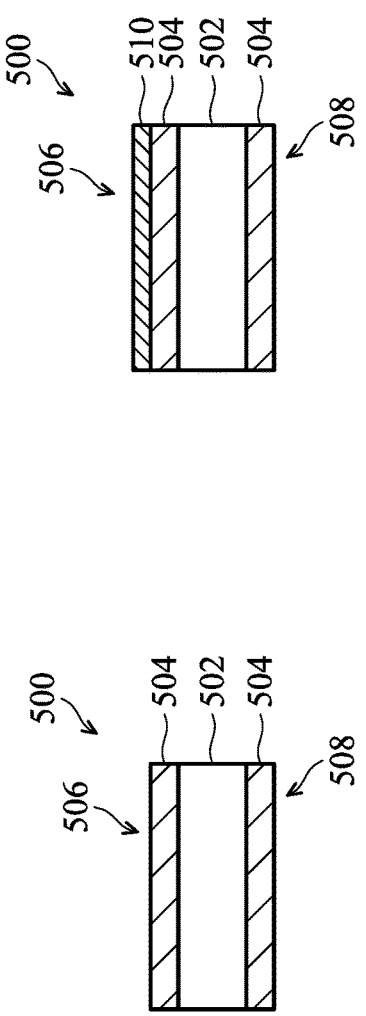

The method 400 proceeds to block 408 where the graphene layer is separated from the dielectric layer. With reference to the example of FIG. 5D, in an embodiment of block 408, the graphene layer 510 (and thus the mounted pellicle frame 512) may be separated from the dielectric layer 504 by way of a wet etching process. In some embodiments, the wet etching process includes a potassium hydroxide (KOH) wet etching process. In some examples, the pellicle 500 may be introduced into a tank 516 that is used to perform the wet etching process that at least partially etches the dielectric layer 504, thereby providing for the release (e.g., the separation) of the graphene layer 510 from the dielectric layer 504. It is noted that the dielectric layer 504 and the graphene layer 510 may not have a strong bond to one another, thereby further enabling the ready release of the graphene layer 510 from the dielectric layer 504 during the wet etching process. As shown in the example of FIG. 5D, the graphene layer 510 and the mounted pellicle frame 512 may remain joined to one another during the wet etching process. After the wet etching process, and as illustrated in FIG. 5E, the pellicle 500 (e.g., including the graphene layer 510 and the pellicle frame 512) may be removed from the tank 516 and dried.

The method 400 then proceeds to block 410 where the capping layer is optionally deposited over the graphene layer of the pellicle. With reference to the example of FIG. 5F, in an embodiment of block 410, after the pellicle has dried, a capping layer 518 may be deposited over the graphene layer 510. In some embodiments, the capping layer 518 may include rhodium (Rh), ruthenium (Ru), technetium (Tc), molybdenum (Mo), niobium (Nb), zirconium (Zr), titanium (Ti), neodymium (Nd), calcium (Ca), beryllium (Be), rubidium (Rb), lanthanum (La), cerium (Ce), barium (Ba), bromine (Br), sodium (Na), selenium (Se), cesium (Cs), potassium (K), phosphorous (P), europium (Eu), praseodymium (Pr), samarium (Sm), tungsten (W), vanadium (V), hafnium (Hf), dysprosium (Dy), gadolinium (Gd), lithium (Li), and alloys thereof. In some embodiments, the capping layer 518 may also or alternatively include boron carbide, silicon carbide, carbon, silicon nitride, silicon, and compounds thereof. In some cases, the capping layer 518 may include other material layer having low EUV absorption. In addition, in various examples, the capping layer 518 may be composed of a material having an amorphous structure, a poly-crystalline structure, or a crystalline structure. In some embodiments, the capping layer 518 may further include different crystal structures such as triclinic, monoclinic, orthorhombic, tetragonal, hexagonal, or cubic. By way of example, the capping layer 518 may have a thickness equal to or less than about 10 nm. Thus, the pellicle 500, which includes the pellicle frame 512 and a graphene pellicle membrane (e.g., the graphene layer 510), may be mounted onto a mask (e.g., as shown in FIGS. 3A/3B) for subsequent exposure processes. In various embodiments, a total thickness of the pellicle membrane (e.g., either the graphene layer 510 alone, or the graphene layer 510 and the capping layer 518) may be less than or equal to about 20 nm. In some embodiments, by appropriately tuning the thickness of the pellicle membrane, embodiments of the present disclosure may provide pellicle membranes having a transmittance greater than or equal to about 90%.

Figure 6A:
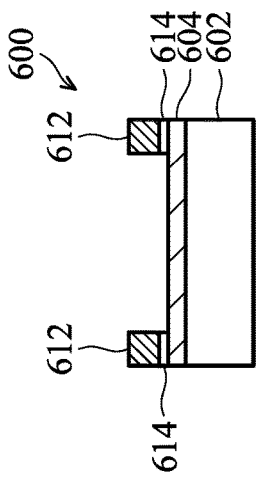
FIGS. 6A, 6B, 6C, and 6D illustrate cross-sectional views of an embodiment of pellicle fabrication according to one or more aspects of the method of FIG. 4B.
Figure 6B:
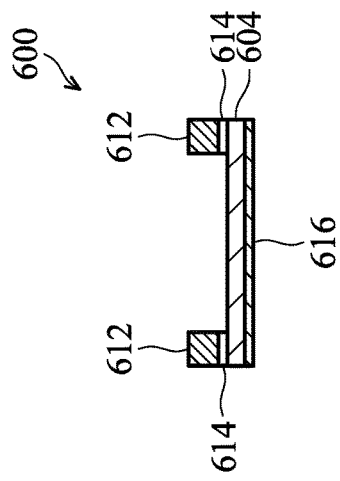
Figure 6C:
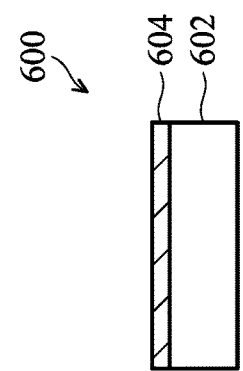
Figure 6D:
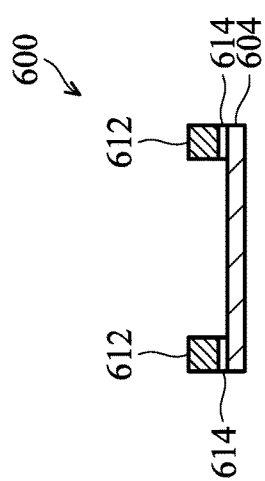

Referring now to FIG. 4B, provided therein is an alternative method 420 to fabricate a carbon-based pellicle including a graphene pellicle membrane, in accordance with some embodiments. In addition, FIGS. 6A-6D include various cross-sectional views of a pellicle 600 at various stages of fabrication according to the method 420. Instead of forming a graphene layer on or transferring a graphene layer to a dielectric layer, as in the method 400 above, the method 420 uses a metal foil as a catalyst for graphene layer formation. The method 420 begins at block 422 where a graphene layer is formed over a metal foil. By way of example, the metal foil may serve as a catalyst for the decomposition of hydrocarbons on the metal foil. With reference to the example of FIG. 6A, in an embodiment of block 422, a metal foil 602 is provided and a graphene layer 604 is formed over the metal foil 602. In various embodiments, the graphene layer 604 serves as the pellicle membrane of the pellicle 600. By way of example, the metal foil 602 may include a nickel (Ni) metal foil, a copper (Cu) metal foil, a Cu—Ni metal foil, or other appropriate metal foil. In some embodiments, the graphene layer 604 may be formed by CVD-growth (e.g., involving the catalyzed decomposition of hydrocarbons on the metal foil 602). In various embodiments, and depending at least in part on the metal foil 602, the graphene layer 604 may include monolayer graphene, bilayer graphene, or multi-layer graphene (e.g., including more than two layers).

The method 420 then proceeds to block 423 where a capping layer is optionally deposited over the graphene layer of the pellicle. In various embodiments, the capping layer may have low EUV absorption, good emissivity, and serves to protect the graphene layer 604. To be sure, the capping layer may not be deposited or may alternatively be deposited at block 428, and for purposes of this disclosure, further details regarding the composition of the capping layer is discussed below with reference to block 428. In at least some embodiments, however, the pellicle frame (block 424) may be mounted after deposition of the capping layer.

Thereafter, the method 420 proceeds to block 424 where a pellicle frame is mounted onto the graphene layer. With reference to the example of FIG. 6B, in an embodiment of block 424, a pellicle frame 612 may be mounted to the graphene layer 604 by way of an adhesive (e.g., glue) layer 614. In some embodiments, the pellicle frame 612 may include a vent hole (e.g., with a filter) in order to equalize pressure between the pellicle and the scanner environment.

The method 420 proceeds to block 426 where the metal foil is etched (e.g., to separate the graphene layer from the metal foil). With reference to the example of FIGS. 6B and 6C, in an embodiment of block 426, the metal foil 602 is etched (e.g., using a wet etching process) so that the graphene layer 604 (and thus the mounted pellicle frame 612) are separated from the metal foil 602. In some embodiments, the wet etching process may be performed a variety of etching solutions as may be suitable to etch a particular type of metal foil. In some examples, the wet etching process includes ferric chloride ($FeCl_3$), ammonium persulfate ($(NH_4)_2S_2O_8$), or other appropriate etchant, that etch the metal foil 602 and thereby provide for the release (e.g., the separation) of the graphene layer 604 from the metal foil 602. Similar to the method 400 above, the graphene layer 604 and the mounted pellicle frame 612 may remain joined to one another during the wet etching process. In some embodiments, after the wet etching process, the pellicle 600 (e.g., including the graphene layer 604 and the pellicle frame 612) may be removed from the wet etching solution and dried.

The method 420 then proceeds to block 428 where the capping layer is optionally deposited over the graphene layer of the pellicle. With reference to the example of FIG. 6D, in an embodiment of block 428, a capping layer 616 may be deposited over the graphene layer 604. In some embodiments, the capping layer 616 may include rhodium (Rh), ruthenium (Ru), technetium (Tc), molybdenum (Mo), niobium (Nb), zirconium (Zr), titanium (Ti), neodymium (Nd), calcium (Ca), beryllium (Be), rubidium (Rb), lanthanum (La), cerium (Ce), barium (Ba), bromine (Br), sodium (Na), selenium (Se), cesium (Cs), potassium (K), phosphorous (P), europium (Eu), praseodymium (Pr), samarium (Sm), tungsten (W), vanadium (V), hafnium (Hf), dysprosium (Dy), gadolinium (Gd), lithium (Li), and alloys thereof. In some embodiments, the capping layer 616 may also or alternatively include boron carbide, silicon carbide, carbon, silicon nitride, silicon, and compounds thereof. In some cases, the capping layer 616 may include other material layer having low EUV absorption. In addition, in various examples, the capping layer 616 may be composed of a material having an amorphous structure, a poly-crystalline structure, or a crystalline structure. In some embodiments, the capping layer 616 may further include different crystal structures such as triclinic, monoclinic, orthorhombic, tetragonal, hexagonal, or cubic. By way of example, the capping layer 616 may have a thickness equal to or less than about 10 nm. Thus, the pellicle 600, which includes the pellicle frame 612 and a graphene pellicle membrane (e.g., the graphene layer 604), may be mounted onto a mask (e.g., as shown in FIGS. 3A/3B) for subsequent exposure processes. In various embodiments, a total thickness of the pellicle membrane (e.g., either the graphene layer 604 alone, or the graphene layer 604 and the capping layer 616) may be less than or equal to about 20 nm. As discussed above, by appropriately tuning the thickness of the pellicle membrane, embodiments of the present disclosure may provide pellicle membranes having a transmittance greater than or equal to about 90%.

Figures 4C, 4D:
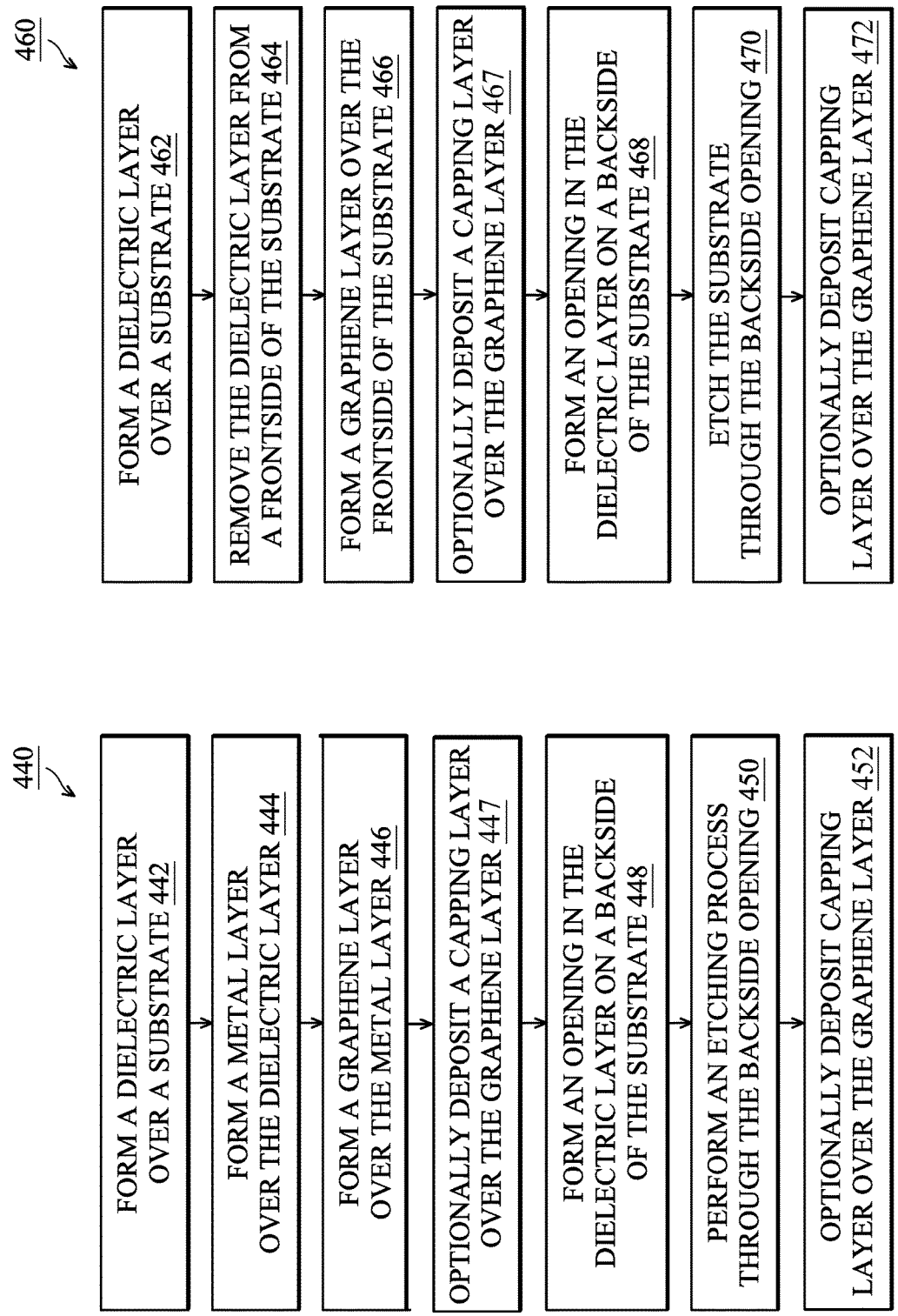

With reference now to FIG. 4C, provided therein is a method 440 to fabricate a carbon-based pellicle including a graphene pellicle membrane, in accordance with some embodiments. Additionally, FIGS. 7A-7G include various cross-sectional views of a pellicle 700 at various stages of fabrication according to the method 440. The method 440 begins at block 442 where a substrate is provided, and a dielectric layer is formed over the substrate. With reference to the example of FIG. 7A, in an embodiment of block 442, a dielectric layer 704 is deposited over a substrate 702. By way of example, the substrate 702 may include a silicon substrate, or other type of substrate, as described above with reference to the method 400. As shown in the example of FIG. 7A, the dielectric layer 704 may be deposited over a front surface 706 and over a back surface 708 of the substrate 702. In some embodiments, the dielectric layer 704 may include a SiN layer, a LPSiN layer, a silicon oxide layer, a silicon oxynitride layer, or other suitable dielectric layer, as described above with reference to the method 400. In some examples, the dielectric layer 704 may have a thickness equal to about 50 nm.

The method 440 proceeds to block 444 where a metal layer is formed over the dielectric layer. With reference to the example of FIG. 7B, in an embodiment of block 444, a metal layer 710 is formed over the dielectric layer 704, for example, on the front surface 706 of the substrate 702. In some cases, the metal layer 710, like the metal foil 602 discussed above with reference to the method 420, may serve as a catalyst for graphene layer formation. In some embodiments, the metal layer 710 may include Ni, Cu, Pd, Ru, Ir, Co, an alloy thereof, or other appropriate metal layer. In some embodiments, the metal layer 710 may be deposited by evaporation, PVD, or other appropriate deposition technique. In some examples, the metal layer 710 may have a thickness equal to between about 10 nm and 50 microns. It is also noted that in various embodiments, the dielectric layer 704 effectively blocks the metal layer 710 from the substrate 702, thereby avoiding formation of a metal silicide layer.

The method 440 proceeds to block 446 where a graphene layer is formed over the metal layer. With reference to the example of FIG. 7C, in an embodiment of block 446, a graphene layer 712 is formed over the metal layer 710. In various embodiments, the graphene layer 712 serves as the pellicle membrane of the pellicle 700. In some embodiments, the graphene layer 712 may be formed by CVD-growth (e.g., involving the catalyzed decomposition of hydrocarbons on the metal layer 710). In various embodiments, and depending at least in part on the metal layer 710, the graphene layer 712 may include monolayer graphene, bilayer graphene, or multi-layer graphene (e.g., including more than two layers). In some embodiments, a capping layer (e.g., having properties as described above) may optionally be deposited at block 447, after formation of the graphene layer at block 446, and prior to formation of the opening in the dielectric layer at block 448. To be sure, the capping layer may not be deposited or may alternatively be deposited at block 452, after performing the etching process at block 450.

Thereafter, the method 440 proceeds to block 448 where an opening is formed in the dielectric layer. With reference to the example of FIG. 7D, in an embodiment of block 448, an opening 714 may be formed within the dielectric layer 704 on the back surface 708 of the substrate 702. In some embodiments, the opening 714 may be formed by a photolithography and etching process. For example, a resist layer may be deposited over the dielectric layer 704 on the back surface 708, and patterned to expose the dielectric layer 704 on the back surface 708. Thereafter, an etching process of the exposed dielectric layer 704 (e.g., a wet or dry etching process) may be performed to form the opening 714 on the back surface 708, exposing a portion of the substrate 702. In some embodiments, the patterned resist layer may be removed (e.g., by an solvent), for example, after formation of the opening 714. It is noted that formation of the opening 714 forms a patterned dielectric layer 704A on the back surface 708 of the substrate 702. In various embodiments, the patterned dielectric layer 704A may be used as a hard mask (HM) during subsequent etching processes, as described below.

The method 440 proceeds to block 450 where an etching process is performed. With reference to the example of FIGS. 7D and 7E, in an embodiment of block 450, an etching process is used to etch a portion of the exposed substrate 702, while using the patterned dielectric layer 704A as a hard mask (HM). In some embodiments, the substrate 702 etching process may be a wet etching process including HNA (a mixture of hydrofluoric acid, nitric acid, and acetic acid), tetra methyl ammonium hydroxide (TMAH), KOH, or other appropriate etchant. In some cases, a dry etching process, or a combination of a wet and dry etching process may be used. As shown in FIG. 7E, the etching process etches a bulk portion of the substrate 702, resulting in a cavity 716, and exposing a portion of the dielectric layer 704 on the front surface 706 of the substrate 702. Referring to FIG. 7F, in a further embodiment of block 450, the dielectric layer 704 on the front surface 706 may then be etched, for example, via the cavity 716, resulting in a cavity 718 that may expose the metal layer 710. In some embodiments, a wet etching process using KOH, buffered HF, or other appropriate etchant, is used to etch the dielectric layer 704 and form the cavity 718. In some cases, a dry etching process or a combination of a wet and dry etching process may be used to form the cavity 718. With reference to FIG. 7G, after formation of the cavity 718 and in an embodiment of block 450, the exposed metal layer 710 may be etched, exposing the graphene layer 712. In some cases, etching of the metal layer 710 may be performed using a wet etching process, similar to the etching of the metal foil 602, discussed above. In some embodiments, the exposed graphene layer 712 is a freestanding graphene layer 712A, which is used as the pellicle membrane. By way of example, portions of a metal-dielectric-substrate-dielectric stack 720, which remain on either side of the freestanding graphene layer 712A, may serve as a pellicle frame 720, similar to the pellicle frames discussed above. In some embodiments, a capping layer may be optionally deposited over the graphene layer 712 and/or 712A at block 452, and as described above. Thus, the pellicle 700, which includes the pellicle frame 720 and a graphene pellicle membrane (e.g., the freestanding graphene layer 712A), may be mounted onto a mask (e.g., as shown in FIGS. 3A/3B) for subsequent exposure processes. In addition, as described above, a total thickness of the pellicle membrane (e.g., either the graphene layer alone, or the graphene layer and the capping layer) may be tuned (e.g., less than or equal to about 20 nm), in order to provide pellicle membranes having a transmittance greater than or equal to about 90%.

With reference now to FIG. 4D, provided therein is a method 460 to fabricate a carbon-based pellicle including a graphene pellicle membrane, in accordance with some embodiments. Additionally, FIGS. 8A-8E include various cross-sectional views of a pellicle 800 at various stages of fabrication according to the method 460. The method 460 shares some aspects of the methods described above. However, in at least some embodiments, the method 460 utilizes a quartz substrate upon which graphene may be directly grown, without the use of a metal catalyst layer. Additional details of the method 460 are provided below. The method 460 begins at block 462 where a substrate is provided, and a dielectric layer is formed over the substrate. With reference to the example of FIG. 8A, in an embodiment of block 462, a dielectric layer 804 is deposited over a substrate 802. By way of example, the substrate 802 may include a quartz substrate. In some embodiments, the substrate 802 includes a single crystal quartz substrate such as an AT-cut single crystal quartz substrate, an X-cut single crystal quartz substrate, a Y-cut single crystal quartz substrate, a Z-cut single crystal quartz substrate, an ST-cut single crystal quartz substrate, or other appropriate quartz substrate. As shown in the example of FIG. 8A, the dielectric layer 804 may be deposited over a front surface 806 and over a back surface 808 of the substrate 802. In some embodiments, the dielectric layer 804 may include a SiN layer, a LPSiN layer, a silicon oxide layer, a silicon oxynitride layer, or other suitable dielectric layer, as described above. In some examples, the dielectric layer 804 may have a thickness equal to about 50 nm.

The method 460 proceeds to block 464 where the dielectric layer is removed from the front surface of the substrate. With reference to the example of FIGS. 8A and 8B, in an embodiment of block 464, the dielectric layer 804 is removed from the front surface 806 of the substrate 802, for example, using a wet or dry etching process, thereby exposing the front surface 806 of the substrate 802.

The method 460 proceeds to block 466 where a graphene layer is formed on the front surface of the substrate. With reference to the example of FIG. 8C, in an embodiment of block 466, a graphene layer 812 is formed over the exposed front surface 806 of the substrate 802. In various embodiments, the graphene layer 812 serves as the pellicle membrane of the pellicle 800. In some embodiments, the graphene layer 812 may be directly grown on the dielectric layer front surface 806 of the quartz substrate 802, for example, using a CVD process. In some examples, such a CVD process may include a catalyst-free CVD process. Alternatively, in some embodiments, the graphene layer 812 may include graphene transferred from another substrate onto the substrate 802, as described above. In various embodiments, the graphene layer 812 may include monolayer graphene, bilayer graphene, or multi-layer graphene (e.g., including more than two layers). In some embodiments, a capping layer (e.g., having properties as described above) may optionally be deposited at block 467, after formation of the graphene layer at block 466, and prior to formation of the opening in the dielectric layer at block 468. To be sure, the capping layer may not be deposited or may alternatively be deposited at block 472, after etching the substrate at block 470.

Thereafter, the method 460 proceeds to block 468 where an opening is formed in the dielectric layer. With reference to the example of FIG. 8D, in an embodiment of block 468, an opening 814 may be formed within the dielectric layer 804 on the back surface 808 of the substrate 802. In some embodiments, the opening 814 may be formed by a photolithography and etching process, as discussed above with reference to formation of the opening 714 (FIG. 7D). Thus, the opening 814 on the back surface 808 may expose a portion of the substrate 802. It is noted that formation of the opening 814 forms a patterned dielectric layer 804A on the back surface 808 of the substrate 802. In various embodiments, the patterned dielectric layer 804A may be used as a hard mask (HM) during subsequent etching processes, as described below.

The method 460 proceeds to block 470 where an etching process is performed. With reference to the example of FIGS. 8D and 8E, in an embodiment of block 470, an etching process is used to etch a portion of the exposed substrate 802, while using the patterned dielectric layer 804A as a hard mask (HM). In some embodiments, the substrate 802 etching process may be a wet etching process including buffered hydrofluoric acid (BHF), or other appropriate etchant. In some cases, a dry etching process, or a combination of a wet and dry etching process may be used. As shown in FIG. 8E, the etching process etches a bulk portion of the substrate 802, resulting in a cavity 816, and exposing the graphene layer 812. In some embodiments, the exposed graphene layer 812 is a freestanding graphene layer 812A, which is used as the pellicle membrane. By way of example, portions of a substrate-dielectric stack 820, which remain on either side of the freestanding graphene layer 812A, may serve as a pellicle frame 820, similar to the pellicle frames discussed above. In some embodiments, a capping layer may be optionally deposited over the graphene layer 812 and/or 812A at block 472, and as described above. Thus, the pellicle 800, which includes the pellicle frame 820 and a graphene pellicle membrane (e.g., the freestanding graphene layer 812A), may be mounted onto a mask (e.g., as shown in FIGS. 3A/3B) for subsequent exposure processes. In addition, as described above, a total thickness of the pellicle membrane (e.g., either the graphene layer alone, or the graphene layer and the capping layer) may be tuned (e.g., less than or equal to about 20 nm), in order to provide pellicle membranes having a transmittance greater than or equal to about 90%.

Figure 4E:
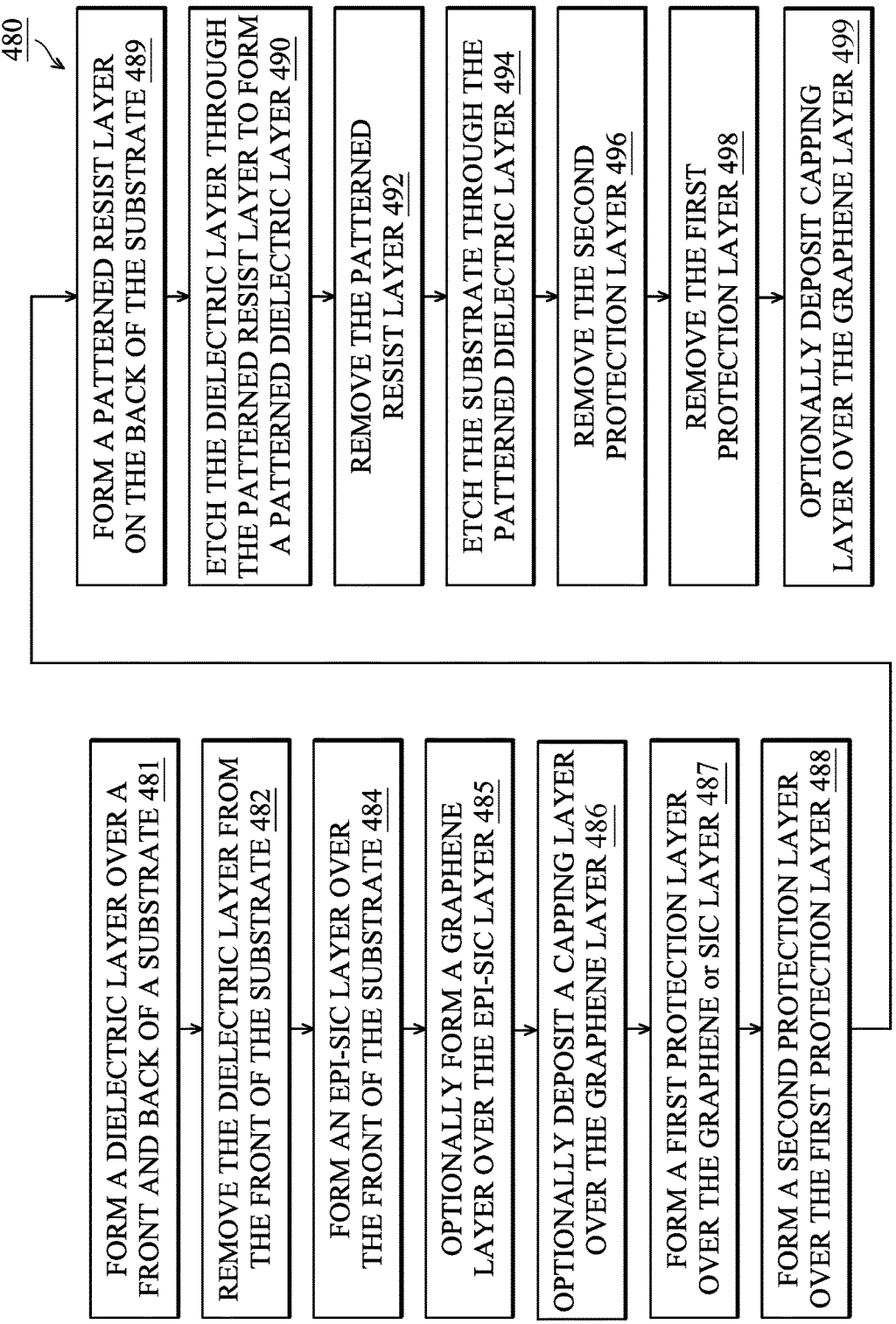

With reference now to FIG. 4E, provided therein is a method 480 to fabricate a carbon-based pellicle, in accordance with some embodiments. Additionally, FIGS. 9A-9M include various cross-sectional views of a pellicle 900 at various stages of fabrication according to the method 480. The method 480 shares some aspects of the methods described above. However, in various embodiments, the method 480 provides a carbon-based pellicle membrane including at least one of a graphene-SiC pellicle membrane and a SiC pellicle membrane. To be sure, aspects of the method 480 may also employed to fabricate a graphene pellicle membrane, as described above. Additional details of the method 480 are provided below. The method 480 begins at block 481 where a substrate is provided, and a dielectric layer is formed over the substrate. With reference to the example of FIG. 9A, in an embodiment of block 481, a dielectric layer 904 is deposited over a substrate 902. By way of example, the substrate 902 may include a silicon substrate, or other type of substrate, as described above with reference to the method 400. As shown in the example of FIG. 9A, the dielectric layer 904 may be deposited over a front surface 906 and over a back surface 908 of the substrate 902. In some embodiments, the dielectric layer 904 may include a SiN layer, a LPSiN layer, a silicon oxide layer, a silicon oxynitride layer, or other suitable dielectric layer, as described above. In some examples, the dielectric layer 904 may have a thickness equal to about 50 nm.

The method 480 proceeds to block 482 where the dielectric layer is removed from the front surface of the substrate. With reference to the example of FIGS. 9A and 9B, in an embodiment of block 482, the dielectric layer 904 is removed from the front surface 906 of the substrate 902, for example, using a wet or dry etching process, thereby exposing the front surface 906 of the substrate 902.

The method 480 proceeds to block 484 where an epitaxial SiC layer is formed over the front surface of the substrate. With reference to the example of FIG. 9C, in an embodiment of block 484, an epitaxial SiC layer 910 is formed over the front surface 906 of the substrate 902. In some embodiments, the epitaxial SiC layer 910 may be formed by an epitaxial CVD process. By way of example, the epitaxial SiC layer 910 may have a carbon content greater than about 20%. In at least some embodiments, the epitaxial SiC layer 910 has a carbon content in a range between about 30-50%. In at least some embodiments, the epitaxial SiC layer 910 includes 3C—SiC. In some examples, 3C—SiC is attractive due in part to its lattice constant (4.3596), which is relatively close to the lattice constant of Si (5.431). Alternatively, in some cases, the epitaxial SiC layer 910 includes 4H—SiC or 6H—SiC. In some embodiments, the thickness of the epitaxial SiC layer 910 may be in a range of about 5 nm to about 20 nm. In some cases, the thickness of the epitaxial SiC layer 910 may depend on, at least in part, a thickness of an optional graphene layer 912 deposited over the epitaxial SiC layer 910, described below. In at least some embodiments, at block 484, an alternative epitaxial material may be deposited (e.g., instead of, or in addition to, the epitaxial SiC layer 910). For instance, in some cases, the alternative epitaxial material may include SiN, $Al_2O_3$, AlN, SiGe, GaN, GaAs, InN, and/or InAs.

The method 480 proceeds to block 485 where a graphene layer is optionally formed on the epitaxial SiC layer. With reference to the example of FIG. 9D, in an embodiment of block 485, a graphene layer 912 is optionally formed over the epitaxial SiC layer 910. In embodiments where the graphene layer 912 is formed over the epitaxial SiC layer 910, the stacked graphene layer 912/epitaxial SiC layer 910 form the pellicle membrane of the pellicle 900. Alternatively, in embodiments where the graphene layer 912 is not formed over the epitaxial SiC layer 910, the epitaxial SiC layer 910 alone may form the pellicle membrane of the pellicle 900. For purposes of discussion, it is assumed that the graphene layer 912 is formed over the expitaxial SiC layer 910, as shown in FIG. 9D. In some embodiments, the graphene layer 912 may be directly grown on the epitaxial SiC layer 910, for example, using a CVD process. In some examples, such a CVD process may include a catalyst-free CVD process. Alternatively, in some embodiments, the graphene layer 912 may include graphene transferred from another substrate onto the substrate epitaxial SiC layer 910, as described above. In various embodiments, the graphene layer 912 may include monolayer graphene, bilayer graphene, or multi-layer graphene (e.g., including more than two layers). In some embodiments, a capping layer (e.g., having properties as described above) may optionally be deposited at block 486, after formation of the graphene layer at block 485, and prior to formation of the first protection layer at block 487. To be sure, the capping layer may not be deposited or may alternatively be deposited at block 499, after removal of the first protection layer at block 498. In some embodiments, the thickness of the graphene layer 912 may be in a range of about 5 nm to about 20 nm. Moreover, in embodiments including the stacked graphene layer 912/epitaxial SiC layer 910, a total thickness of the stacked graphene layer 912/epitaxial SiC layer 910 may be equal to or less than about 20 nm. Thus, for example, if the graphene layer 912 thickness is about 5 nm, the epitaxial SiC layer 912 thickness may be about 15 nm. As another example, if the epitaxial SiC layer 912 thickness is about 5 nm, the graphene layer thickness may be about 15 nm. While some examples of thicknesses of each of the graphene layer 912 and the epitaxial SiC layer 912 have been given, it will be understood that these examples are merely exemplary, and other thicknesses may equally be used without departing from the scope of the present disclosure. As previously discussed, by tuning the thickness of the pellicle membrane, embodiments of the present disclosure may provide pellicle membranes having a transmittance greater than or equal to about 90%.

It is also noted that contrary to relatively weaker bond between the graphene layer 510 and the dielectric layer 504 discussed above with reference to the method 400, the graphene layer 912 and the epitaxial SiC layer 910 may have a relatively stronger bond. For example, in some cases, about 30% of the carbon atoms within the graphene layer 912 may form bonds (e.g., such as covalent bonds) to silicon atoms within the epitaxial SiC layer 910. Thus, the interface adhesion between the epitaxial SiC layer 910 and the graphene layer 912 is improved. In part because of this improved adhesion, the graphene layer 912 may not easily peel off from the epitaxial SiC layer 910, the graphene layer 912 may have substantially no wrinkles, and the epitaxial SiC layer 910 may provide a support layer to the graphene layer 912. Also, because of the strong adhesion between the epitaxial SiC layer 910 and the graphene layer 912, the risk of shatter (e.g., that may exist for a SiC-only pellicle membrane) is mitigated by way of the graphene layer 912 which effectively adheres to (e.g., "grabs") the epitaxial SiC layer. Thus, in the event of breakage of the SiC layer 910 (e.g., in embodiments including a stacked graphene layer 912/epitaxial SiC layer 910 pellicle membrane), the graphene layer 912 may effectively "grab" the broken SiC layer 910, thereby avoiding substantial process chamber contamination. Moreover, in embodiments including a silicon substrate 902 and where the epitaxial SiC layer 910 includes a 3C—SiC layer, the epitaxial SiC layer 910 may have a relatively small lattice mismatch to both the underlying silicon substrate 902 and the overlying graphene layer 912.

The method 480 then proceeds to block 487 where a first protection layer is deposited over the graphene layer (if present) or over the SiC layer (e.g., if the graphene layer is not present). With reference to the example of FIG. 9E, in an embodiment of block 487, a first protection layer 914 is deposited over the graphene layer 912. In some embodiments, the first protection layer 914 includes an amorphous-Si layer, a SiN layer, or other appropriate layer. In some cases, the first protection layer 914 may be deposited by CVD, ALD, or PVD, and may have a thickness equal to between about 1.5 nm and 1 micron.

Thereafter, the method 480 then proceeds to block 488 where a second protection layer is formed over the first protection layer. With reference to the example of FIG. 9F, in an embodiment of block 488, a second protection layer 916 is formed over the first protection layer 914. In some embodiments, the second protection layer 916 includes a polymer layer such as PMMA, polystyrene, an organic crosslinking material, or other appropriate layer. In some cases, the second protection layer 916 may be deposited by spin-coating, vapor deposition, or other appropriate method, and may have a thickness equal to between about 1.5 nm and 1 micron.

The method 480 proceeds to block 489 where a patterned resist layer is formed on the back surface of the substrate. With reference to the example of FIGS. 9G and 9H, in an embodiment of block 489, a resist layer 918 may be deposited over the dielectric layer 904 on the back surface 908, and patterned (e.g., by a exposure and development process) to form a patterned resist layer 918A on the back surface 908. As shown in FIG. 9H, the patterned resist layer 918A forms an opening 920 that exposes a portion of the dielectric layer 904 on the back surface 908.

The method 480 proceeds to block 490 where the dielectric layer is etched through the patterned resist layer to form a patterned dielectric layer. With reference to the example of FIGS. 9H and 9I, in an embodiment of block 490, the exposed portion of the dielectric layer 904 is etched (e.g., a wet or dry etching process), while the patterned resist layer 918A is used as an etch mask. As a result of the etching of the dielectric layer 904, a patterned dielectric layer 904A is formed, resulting in an opening 922 that exposes a portion of the substrate 902. The method 480 proceeds to block 492, where the patterned resist layer is removed. Referring to the example of FIGS. 9I and 9J, in an embodiment of block 492, the patterned resist layer 918A may be removed (e.g., by an solvent). In various embodiments, the patterned dielectric layer 904A may be used as a hard mask (HM) during subsequent etching processes, as described below.

The method 480 proceeds to block 494 where an etching process is performed. With reference to the example of FIGS. 9J and 9K, in an embodiment of block 494, an etching process is used to etch a portion of the exposed substrate 902, while using the patterned dielectric layer 904A as a hard mask (HM). In some embodiments, the substrate 902 etching process may be a wet etching process including HNA (a mixture of hydrofluoric acid, nitric acid, and acetic acid), tetra methyl ammonium hydroxide (TMAH), KOH, or other appropriate etchant. In some cases, a dry etching process, or a combination of a wet and dry etching process may be used. As shown in FIG. 9K, the etching process etches a bulk portion of the substrate 902, resulting in a cavity 924, and exposing a portion of the epitaxial SiC layer 910.

The method 480 proceeds to block 496 where the second protection layer is removed. With reference to the example of FIGS. 9K and 9L, in an embodiment of block 496, the second protection layer 916 is removed from the front surface 906 (e.g., by a solvent, by ashing, or by another appropriate process). Thereafter, the method 480 proceeds to block 498 where the first protection layer is removed. With reference to the example of FIGS. 9L and 9M, in an embodiment of block 498, the first protection layer 916 is removed from the front surface 906. In some embodiments, the first protection layer may be removed by a wet etching process, a dry etching process, or by a combination thereof.

After removal of the first protection layer, the stacked graphene layer 912/epitaxial SiC layer 910 form the pellicle membrane of the pellicle 900. By way of example, portions of a dielectric-substrate stack 926 may serve as a pellicle frame 926, similar to the pellicle frames discussed above. In some embodiments, a capping layer may be optionally deposited over the graphene layer 912 at block 499, and as described above. Thus, the pellicle 900, which includes the pellicle frame 926 and stacked graphene layer 912/epitaxial SiC layer 910 pellicle membrane, may be mounted onto a mask (e.g., as shown in FIGS. 3A/3B) for subsequent exposure processes. As discussed above, alternative embodiments may include a pellicle membrane including only a graphene pellicle membrane, or only a SiC pellicle membrane, in addition to the bilayer stacked pellicle membrane discussed above. Furthermore, while the bilayer stacked pellicle membrane of the method 480 was described as a graphene/SiC pellicle membrane, other bilayer stacked pellicle membranes are envisioned as falling within the scope of the present disclosure. For example, some embodiments may include a graphene/SiN pellicle membrane, a graphene/$Al_2O_3$ pellicle membrane, a graphene/AlN pellicle membrane, a graphene/SiGe pellicle membrane, a graphene/GaN pellicle membrane, a graphene/GaAs pellicle membrane, a graphene/InN pellicle membrane, or a graphene/InAs. Moreover, some embodiments may include pellicle membranes without graphene and including at least one of SiN, $Al_2O_3$, AlN, SiGe, GaN, GaAs, InN, and/or InAs.

With respect to the description provided herein, the present disclosure offers a pellicle fabrication method and related structures which employ a carbon-based pellicle membrane such as a graphene pellicle membrane, a graphene-silicon carbide (SiC) pellicle membrane, and/or a SiC pellicle membrane. The carbon-based pellicle membranes disclosed herein provide superior mechanical and thermal properties (e.g., such as emissivity, thermal conductivity, and mechanical strength) as compared to at least some existing pellicle membranes. Thus, because of their superior thermal emissivity and thermal conductivity, the temperature of the carbon-based pellicle membranes disclosed herein will remain substantially lower (e.g., during EUV light exposure) than polysilicon-based pellicle membranes. Adding superior strength to the favorable thermal properties, embodiments of the present disclosure thereby effectively mitigate the stress, and the potential pellicle membrane shattering and process chamber contamination issues, which remains a significant challenge for at least some existing processes. Moreover, the carbon-based pellicle membranes disclosed herein provide superior EUV transmission compared to at least some existing pellicle membranes. Thus, embodiments of the present disclosure provide pellicle membranes that are stronger and more reliable than their existing counterparts, thereby extending the pellicle lifetime and practical usage. Those skilled in the art will recognize other benefits and advantages of the methods and structures as described herein, and the embodiments described are not meant to be limiting beyond what is specifically recited in the claims that follow.

Thus, embodiments of the present disclosure described a method for fabricating a pellicle. In some embodiments, the method includes forming a first dielectric layer over a back surface of a substrate. After forming the first dielectric layer, and in some embodiments, a graphene layer is formed over a front surface of the substrate. In some examples, after forming the graphene layer, the first dielectric layer is patterned to form an opening in the first dielectric layer that exposes a portion of the back surface of the substrate. Thereafter, while using the patterned first dielectric layer as a mask, an etching process may be performed to the back surface of the substrate to form a pellicle having a pellicle membrane that includes the graphene layer.

In some embodiments, discussed is an alternative method of fabricating a pellicle. In various examples, a graphene layer is formed over a substrate. Thereafter, a pellicle frame may be mounted to the graphene layer (e.g., by way of an adhesive layer). In some embodiments, the graphene layer is then separated from the substrate while the pellicle frame remains mounted to the graphene layer. Thus, a pellicle having a pellicle membrane including the graphene layer is provided.

In addition, some embodiments discussed a structure including an EUV lithographic mask, and a pellicle mounted to the EUV lithographic mask. By way of example, the EUV lithographic mask may include a patterned surface. Additionally, in some embodiments, the pellicle may include a pellicle frame and a pellicle membrane suspended by the frame a distance away from the patterned surface. In various examples, the pellicle includes a carbon-based pellicle membrane including one of a graphene pellicle membrane, a graphene-silicon carbide (SiC) pellicle membrane, and a SiC pellicle membrane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first dielectric layer over a back surface of a substrate;
    after forming the first dielectric layer, forming a graphene layer over a front surface of the substrate;
    after forming the graphene layer, patterning the first dielectric layer to form an opening in the first dielectric layer that exposes a portion of the back surface of the substrate;
    while using the patterned first dielectric layer as a mask, performing an etching process to the back surface of the substrate to form a pellicle having a pellicle membrane that includes the graphene layer.

2. The method of claim 1, further comprising:
    prior to forming the graphene layer over the front surface of the substrate;

forming a second dielectric layer over the front surface of the substrate;

forming a metal layer over the second dielectric layer; and forming the graphene layer over the metal layer.

3. The method of claim 2, further comprising:

performing the etching process, wherein the etching process etches a portion of the second dielectric layer and a portion of the metal layer, thereby forming the pellicle having the pellicle membrane that includes the graphene layer.

4. The method of claim 1, further comprising:

prior to forming the graphene layer over the front surface of the substrate, forming a silicon carbide (SiC) layer over the front surface of the substrate; and forming the graphene layer over the SiC layer;

wherein performing the etching process forms the pellicle having the pellicle membrane that includes the graphene layer and the SiC layer.

5. The method of claim 4, further comprising:

prior to patterning the first dielectric layer to form the opening in the first dielectric layer, forming a first protection layer over the SiC layer; and forming a second protection layer over the first protection layer.

6. The method of claim 5, wherein the first protection layer includes at least one of an amorphous silicon layer and a nitride layer, and wherein the second protection layer includes a polymer layer.

7. The method of claim 5, further comprising:

after forming the pellicle having the pellicle membrane that includes the graphene layer and the SiC layer, removing the first protection layer and the second protection layer.

8. The method of claim 1, further comprising:

after forming the pellicle having the pellicle membrane that includes the graphene layer, forming a capping layer over the graphene layer, wherein the capping layer has a thickness equal to or less than about 10 nm.

9. The method of claim 8, wherein the capping layer includes one or more of rhodium (Rh), ruthenium (Ru), technetium (Tc), molybdenum (Mo), niobium (Nb), zirconium (Zr), titanium (Ti), neodymium (Nd), calcium (Ca), beryllium (Be), rubidium (Rb), lanthanum (La), cerium (Ce), barium (Ba), bromine (Br), sodium (Na), selenium (Se), cesium (Cs), potassium (K), phosphorous (P), europium (Eu), praseodymium (Pr), samarium (Sm), tungsten (W), vanadium (V), hafnium (Hf), dysprosium (Dy), gadolinium (Gd), lithium (Li), boron carbide, silicon carbide, carbon, silicon nitride, silicon, and alloys or compounds thereof.

10. The method of claim 1, wherein a transmittance of the pellicle membrane is greater than or equal to about 90%.

11. The method of claim 4, wherein a carbon content of the SiC layer is greater than about 20%.

12. A method, comprising:

forming a graphene layer over a substrate;

mounting, with an adhesive, a pellicle frame to the graphene layer; and separating the graphene layer from the substrate while the pellicle frame remains mounted to the graphene layer, thereby providing a pellicle having a pellicle membrane including the graphene layer.

13. The method of claim 12, further comprising:

prior to forming the graphene layer over the substrate, forming a dielectric layer over the substrate, wherein the substrate includes a semiconductor substrate; and forming the graphene layer over the dielectric layer.

14. The method of claim 13, further comprising:

forming the dielectric layer, wherein the dielectric layer includes a nitride layer; and performing a wet etching process to separate the graphene layer from the nitride layer.

15. The method of claim 12, further comprising:

forming the graphene layer over the substrate, wherein the substrate includes a metal foil; and etching the metal foil to separate the graphene layer from the metal foil.

16. The method of claim 15, wherein the metal foil includes at least one of a nickel (Ni) metal foil, a copper (Cu) metal foil, and a Cu—Ni metal foil.

17. The method of claim 12, further comprising:

after separating the graphene layer from the substrate, forming a capping layer over the graphene layer, wherein the capping layer has a thickness equal to or less than about 10 nm.

18. The method of claim 17, wherein the capping layer includes one or more of rhodium (Rh), ruthenium (Ru), technetium (Tc), molybdenum (Mo), niobium (Nb), zirconium (Zr), titanium (Ti), neodymium (Nd), calcium (Ca), beryllium (Be), rubidium (Rb), lanthanum (La), cerium (Ce), barium (Ba), bromine (Br), sodium (Na), selenium (Se), cesium (Cs), potassium (K), phosphorous (P), europium (Eu), praseodymium (Pr), samarium (Sm), tungsten (W), vanadium (V), hafnium (Hf), dysprosium (Dy), gadolinium (Gd), lithium (Li), boron carbide, silicon carbide, carbon, silicon nitride, silicon, and alloys or compounds thereof.

19. A structure, comprising:

an EUV lithographic mask including a patterned surface; and a pellicle mounted to the EUV lithographic mask, wherein the pellicle includes a pellicle frame and a pellicle membrane suspended by the frame a distance away from the patterned surface;

wherein the pellicle includes a carbon-based pellicle membrane including one of a graphene pellicle membrane, a graphene-silicon carbide (SiC) pellicle membrane, and a SiC pellicle membrane.

20. The method of claim 18, wherein the pellicle includes one of the graphene-SiC pellicle membrane and the SiC pellicle membrane, and wherein a carbon content of the SiC is greater than about 20%.

* * * * *